(12) United States Patent  (10) Patent No.: US 8,335,076 B2
Zhang                      (45) Date of Patent:  Dec. 18, 2012

(54) SERVER

(75) Inventor: Yang Zhang, Shanghai (CN)

(73) Assignee: Inventec Corporation, Taipei (TW)

( * ) Notice: Subject to any disclaimer, the term of this patent is extended or adjusted under 35 U.S.C. 154(b) by 175 days.

(21) Appl. No.: 13/029,121

(22) Filed: Feb. 17, 2011

(65) Prior Publication Data

US 2012/0134099 A1  May 31, 2012

(30) Foreign Application Priority Data

Nov. 30, 2010 (TW) ................................ 99141542 A

(51) Int. Cl.
H05K 5/00 (2006.01)
H05K 7/16 (2006.01)
H05K 7/14 (2006.01)
H01R 4/00 (2006.01)
H01R 13/46 (2006.01)

(52) U.S. Cl. ........... 361/679.37; 361/679.39; 361/679.4; 361/724; 361/725; 361/726; 174/365; 174/542; 174/559; 174/59; 174/60

(58) Field of Classification Search .. 361/679.31–679.4, 361/679.55–679.6, 724–727; 174/363–387, 174/542, 559–563, 59–64, 138 B, 138 D, 174/170; 439/157, 60, 152–153, 327, 328, 439/331

See application file for complete search history.

(56) References Cited

U.S. PATENT DOCUMENTS 6,621,692 B1* 9/2003 Johnson et al. .......... 361/679.55
2003/0042824 A1* 3/2003 Coffin et al. ................ 312/223.2
2008/0164795 A1* 7/2008 Peng et al. .................. 312/334.5

* cited by examiner

Primary Examiner — Jayprakash N Gandhi
Assistant Examiner — Jerry Wu
(74) Attorney, Agent, or Firm — Jianq Chyun IP Office

(57) ABSTRACT

A server includes a chassis, a middle plate, a transfer plate, a hard disc module, a main board module and a cable arranging module. The chassis has a bottom plate, two side plates, a front end and a back end. The middle plate divides the chassis into first and second sub-spaces. The transfer plate is disposed in the first sub-space. The main board module and the hard disc module are disposed in the two sub-spaces respectively and suitable for being pulled out from the front end. The cable arranging module includes a fixing frame, a chain structure and a cable set. The fixing frame is fixed on the middle plate. The chain structure is connected between the fixing frame and the hard disc module. The cable set is fixed on the fixing frame and the chain structure and electrically connected to the transfer plate and the hard disc module.

9 Claims, 10 Drawing Sheets

SERVER

CROSS-REFERENCE TO RELATED APPLICATION

This application claims the priority benefit of Taiwan application serial no. 99141542, filed on Nov. 30, 2010. The entirety of the above-mentioned patent application is hereby incorporated by reference herein and made a part of this specification.

BACKGROUND

1. Field of the Invention

The invention relates to a server. Particularly, the invention relates to a server with a pluggable hard disc module.

2. Description of Related Art

A server is a core computer in a network system used for serving various computers, which can provide functions such as storage and print service for network users, and provide clients to share various resources within the network environment. A basic structure of the server is approximately the same to a general personal computer, which is composed of a central processing unit (CPU), a memory and an input/output (I/O) device, etc., and the devices are connected through a bus. A north bridge chip is used to connect the CPU and the memory, and the I/O device is connected through a south bridge chip. A chassis structure of the server has three evolution stages from earlier tower chassis to rack mount chassis stressing centrality, and then blade servers of high-density calculation.

Taking a rack mount server as an example, the rack mount server is a server with an appearance designed according to uniform standards, which is used in collaboration with a cabinet. The rack mount server can be regarded as a tower server with an optimized structure, and a design principle thereof is to reduce a space occupation of the server as far as possible. Many professional network devices apply the rack mount structure, and have a flat shape as that of a drawer, for example, switches, routers and hardware firewalls, etc. A width of the rack mount server is 19 inches, and a height thereof applies a unit of U (1U=1.75 inches=44.45 mm), and the servers are generally complied with standards of 1U, 2U, 3U, 4U, 5U or 7U.

The size of the cabinet is also complied with a common industrial standard, which is generally between 22U and 42U. The cabinet includes a detachable sliding rack according to the height thereof, and the user can flexibly adjust the height according to a height of the server, so as to store network devices such as a server, a hub, a disk array, etc. After the server is settled, the I/O lines thereof are all led out from the rear of the cabinet (all interfaces of the rack mount server are also located at the rear of the cabinet), and are uniformly disposed in a cable slot of the cabinet, and are attached with labels to facilitate management.

Generally, a hard disc module, a main board module, a power connection interface and a data transmission interface of the rack mount server are not located at a same side of a chassis, so that the user cannot pull out the hard disc module and the main board module and plug or unplug a power line and a data transmission line from the same side of the chassis, which is inconvenient in utilization.

SUMMARY OF THE INVENTION

The invention is directed to a server, in which a hard disc module, a main board module, a power connection interface and a data transmission interface are all located at a front end of a chassis.

The invention provides a server including a chassis, a middle plate, a transfer plate, a hard disc module, a main board module and a cable arranging module. The chassis has a bottom plate, two side plates, a front end and a back end. The middle plate is disposed in the chassis. The middle plate is perpendicular to the bottom plate and parallel to the side plates, and divides the chassis into a first sub-space and a second sub-space. The transfer plate is disposed in the first sub-space and is adjacent to the back end. The main board module is disposed in the first sub-space, and is suitable for being pulled out from the front end. The main board module is electrically connected to the transfer plate. The hard disc module is disposed in the second sub-space, and is suitable for being pulled out from the front end. The hard disc module includes a hard disc cage, a back plate and a plurality of hard discs. The hard disc cage is suitable for sliding into the second sub-space from the front end. The hard disc cage has a first side and a second side parallel to the side plates. The second side has a plurality of hard disc openings. The back plate is fixed to the first side of the hard disc cage and is parallel to the middle plate. The hard discs are detachablly disposed in the hard disc cage and electrically connected to the back plate. When the hard disc cage is pulled out from the chassis, the hard discs are suitable for being installed to or pulled out from the hard disc cage through the hard disc openings. The cable arranging module includes a fixing frame, a chain structure and a cable set. The fixing frame is fixed on the middle plate. The chain structure is formed by a plurality of pivoted elements pivoted in sequence. A first end of the chain structure is connected to the fixing frame, and a second end of the chain structure is connected to the hard disc cage. The fixing frame and the chain structure commonly form a chamber. The cable set is located in the chamber and electrically connected to the transfer plate and the back plate. When the hard disc module is located in the chassis, the chain structure is bended and contained in the chassis. When the hard disc module is pulled out from the chassis, the chain structure drives the cable set to be curved and move. When the hard disc module is pulled out from the chassis entirely, the chain structure is extended and at least partially located out of the chassis.

In an embodiment of the invention, the server further includes a plurality of cooling fans disposed at the back end.

In an embodiment of the invention, the server further includes a plurality of power lines connected between the cooling fans and the transfer plate.

In an embodiment of the invention, the transfer plate has a plurality of connectors and a first surface and a second surface opposite to the first surface. The first surface faces to the front end, and the second surface faces to the back end. The connectors are disposed on the first surface, and the power lines are connected between the connectors and the cooling fans.

In an embodiment of the invention, the server further includes a spacing plate disposed at the back end, where a part of the cooling fans is disposed at one side of the spacing plate and aligned to the main board module, and another part of the cooling fans is disposed at another side of the spacing plate and aligned to the hard disc module.

In an embodiment of the invention, the server further includes a power indicating lamp disposed at the front end.

In an embodiment of the invention, the server further includes a data transmission interface, a power connection interface and a first power line. The data transmission interface is disposed at the front end and connected to the main board module. The power connection interface is disposed at the front end and is suitable for connecting an external power supply. The first power line is connected between the power connection interface and the transfer plate. The cable set includes a plurality of data transmission lines and a second power line. The data transmission lines are connected between the hard disc module and the transfer plate, and the second power line is connected between the transfer plate and the hard disc module. The transfer plate has a plurality of connectors respectively connected to the main board module, the data transmission lines, the first power line and the second power line.

In an embodiment of the invention, the server further includes a first slide rail, a second slide rail, a first sliding member and a second sliding member. The first slide rail and the second slide rail are disposed in the second sub-space and parallel to the two side plates. The first sliding member and the second sliding member are slidably disposed on the first slide rail and the second slide rail, respectively, where the hard disc cage is connected to the first sliding member and the second sliding member and located between the first slide rail and the second slide rail. The hard disc module is suitable for being entirely pulled out from the front end of the chassis as the first sliding member and the second sliding member are slid relative to the first slide rail and the second slide rail.

In an embodiment of the invention, the fixing frame is extended along a first axial line, and the first axial line is parallel to an extending direction of the first slide rail and located under the first slide rail. When the hard disc module is located in the chassis, a part of the chain structure is supported on the first slide rail, and is located on a second axial line parallel to the first axial line. When the hard disc module is slid out from the chassis along the first slide rail and the second slide rail, the chain structure supported on the first slide rail departs from the first slide rail along the second axial line, and is at least partially moved to the first axial line, and a part of the cable set is curved along with the chain structure.

According to the above descriptions, the hard disc module and the main board module of the server are all located at the front end of the chassis. In this way, the user can pull out the hard disc module and the main board module from the front end of the chassis, so that utilization convenience is improved.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

Figure 1:
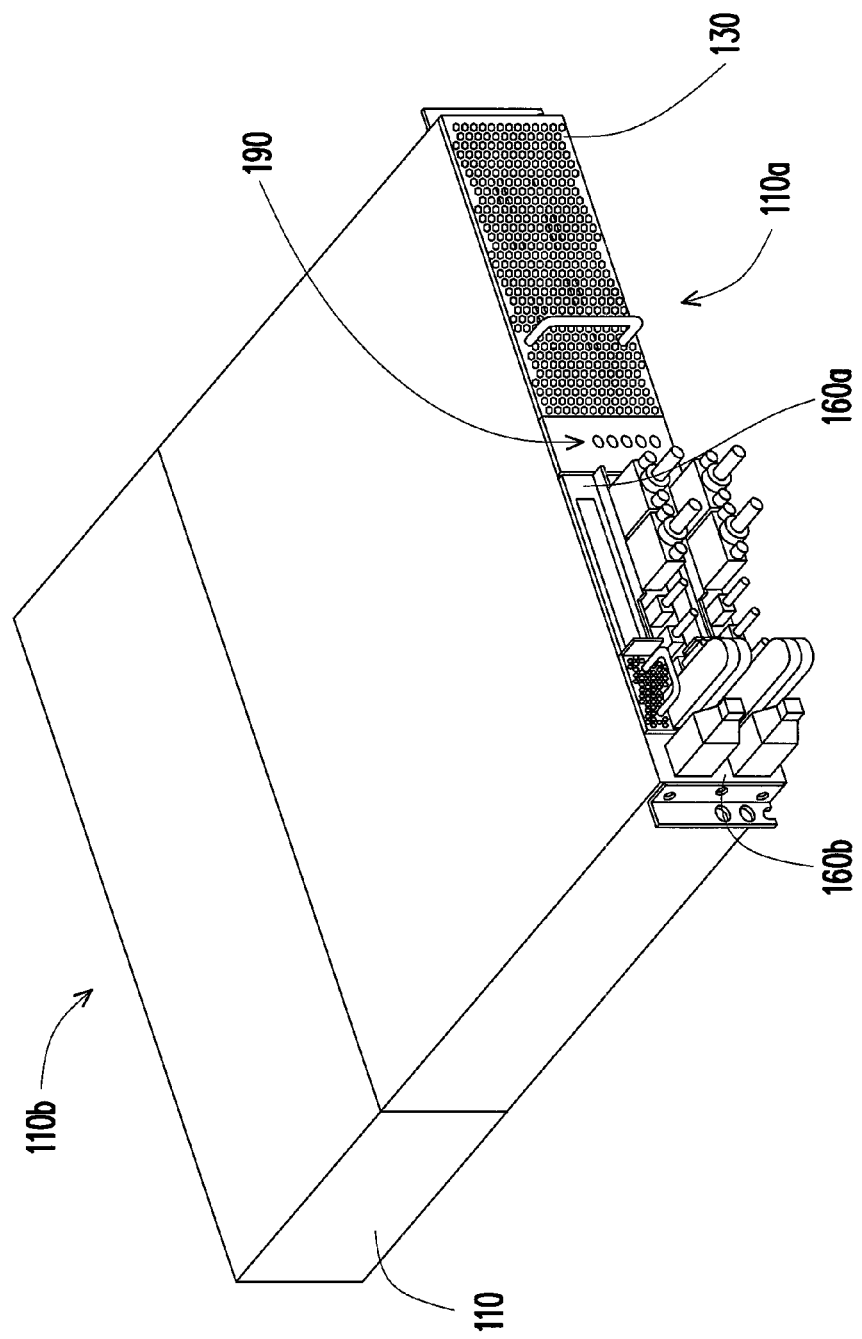
FIG. 1 is a three-dimensional view of a server according to an embodiment of the invention.
Figure 2:
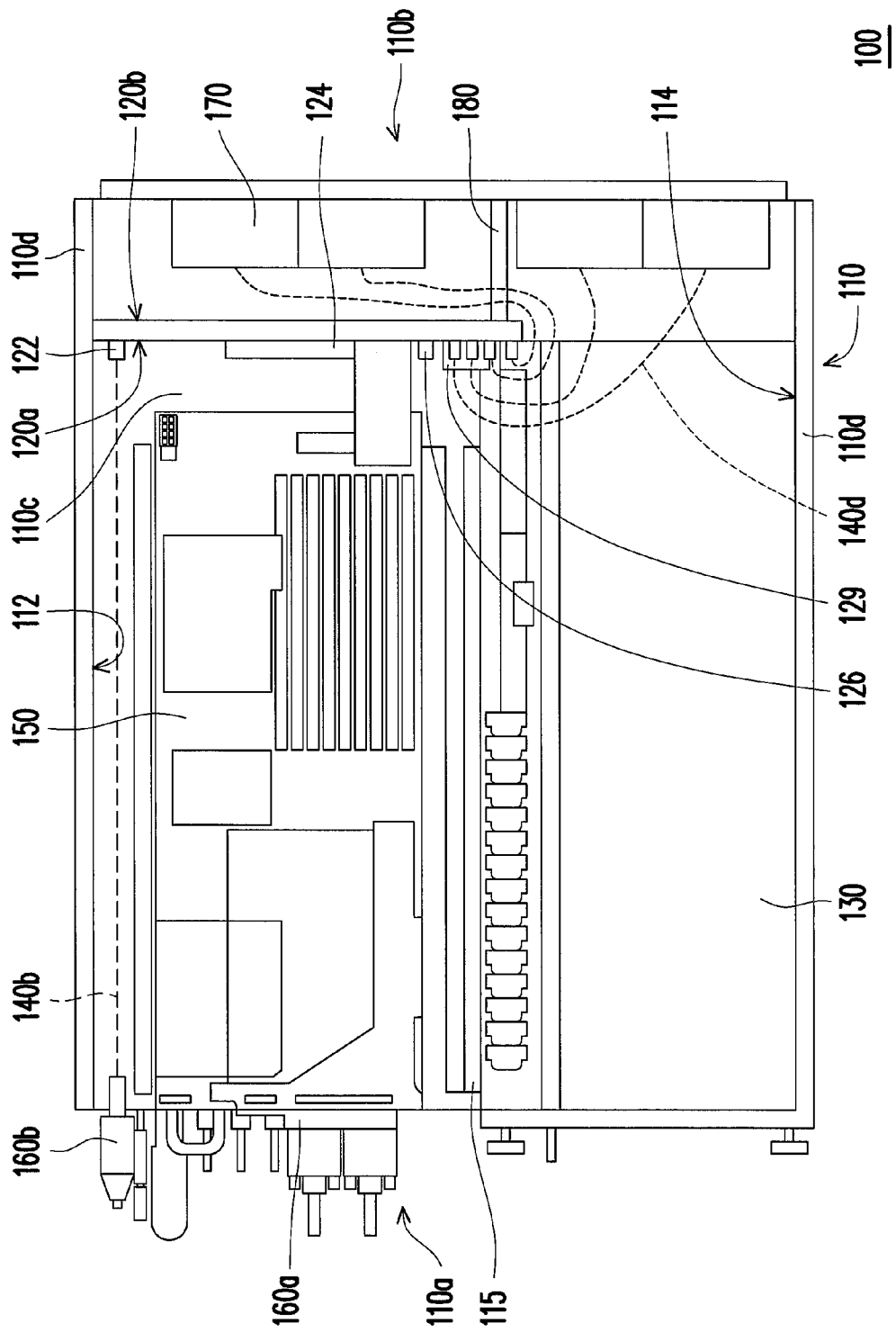
FIG. 2 is a top view of the server of FIG. 1.
Figure 3:
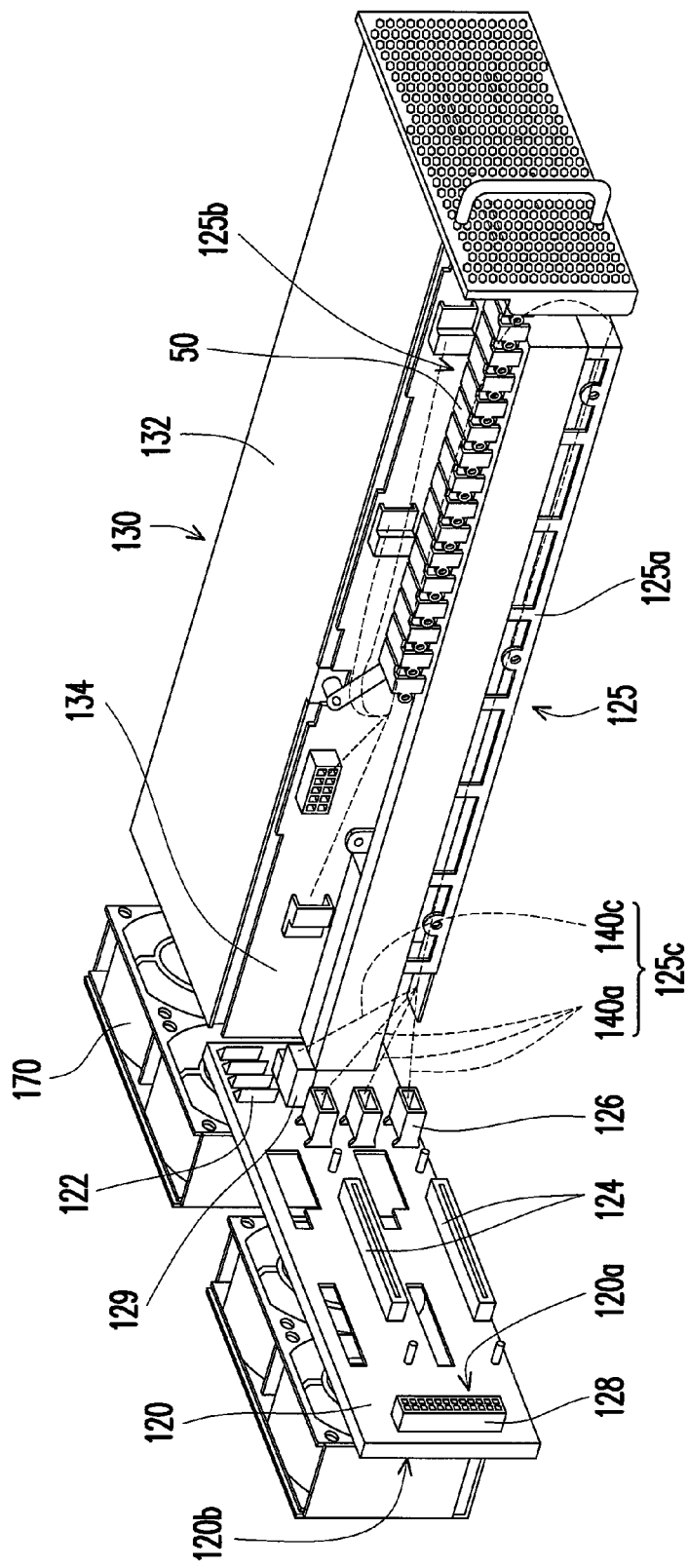
FIG. 3 is a three-dimensional view of a part of components of the server of FIG. 1.

FIG. 1 is a three-dimensional view of a server according to an embodiment of the invention. FIG. 2 is a top view of the server of FIG. 1. FIG. 3 is a three-dimensional view of a part of components of the server of FIG. 1. For clarity's sake, a top surface of a chassis 110 is not illustrated in FIG. 2, and data transmission lines 140$a$, a first power line 140$b$, a second power line 140$c$ and third power lines 140$d$ are drawn in dot lines. Referring to FIG. 1 and FIG. 3, the server 100 of the present embodiment includes a chassis 110, a middle plate 115, a transfer plate 120, a hard disc module 130, a plurality of data transmission lines 140$a$ (three are illustrated), a first power line 140$b$, a second power line 140$c$, a main board module 150, a data transmission interface 160$a$ and a power connection interface 160$b$.

The chassis 110 has a front end 110$a$, a back end 110$b$, a bottom plate 110$c$ and two side plates 110$d$. The middle plate 115 is disposed in the chassis 110. The middle plate 115 is perpendicular to the bottom plate 110$c$ and parallel to the side plates 110$d$, and divides the chassis 110 into a first sub-space 112 and a second sub-space 114. The transfer plate 120 is disposed in the first sub-space 112 and is adjacent to the back end 110$b$. The hard disc module 130 is, for example, a pluggable hard disc module and disposed in the second sub-space 114, and is suitable for being pulled out from the front end 110$a$. The data transmission lines 140$a$ are connected between the hard disc module 130 and the transfer plate 120. The main board module 150 is disposed in the first sub-space 112, and is suitable for being pulled out from the front end 110$a$, where the main board module 150 is electrically connected to the transfer plate 120.

The data transmission interface 160$a$ is disposed at the front end 110$a$ and connected to the main board module 150. The power connection interface 160$b$ is disposed at the front end 110$a$ and is suitable for connecting an external power supply (not shown). The first power line 140$b$ is connected between the power connection interface 160$b$ and the transfer plate 120, so that the main board module 150 is connected to the external power supply through the transfer plate 120. Moreover, the second power line 140$c$ is connected between the transfer plate 120 and the hard disc module 130 for providing power required by the hard disc module 130.

According to such configuration, the hard disc module 130, the main board module 150, the power connection interface 160$b$ and the data transmission interface 160$a$ are all located at the front end 110$a$ of the chassis 110, so that a user can pull out the hard disc module 130 and the main board module 150 and plug or unplug a power line (not shown) and a data transmission line (not shown) from the front end 110$a$ of the chassis 110, so that utilization convenience is improved.

Figure 4:
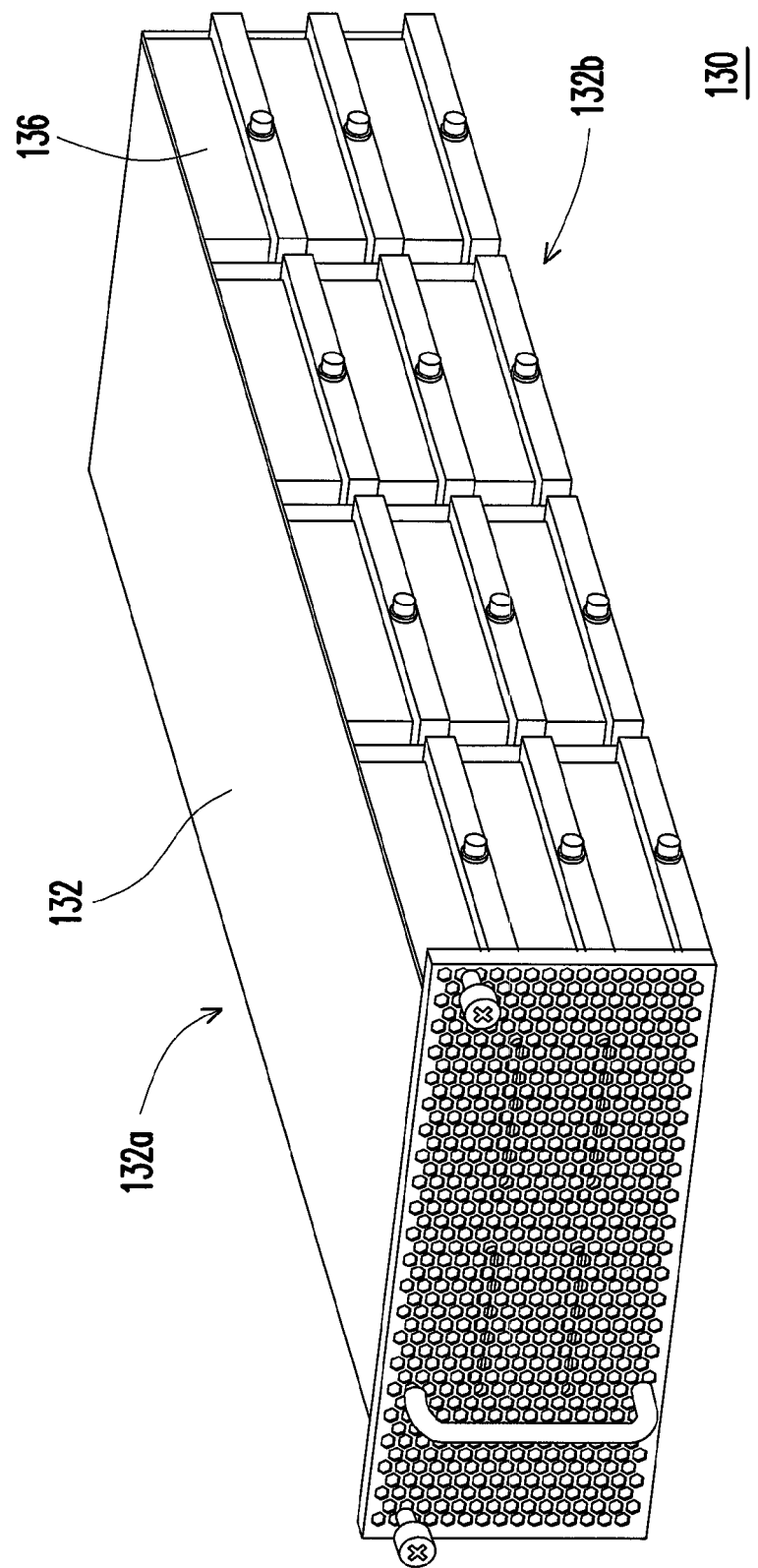
FIG. 4 is a three-dimensional view of a hard disc module of FIG. 1.
Figure 5:
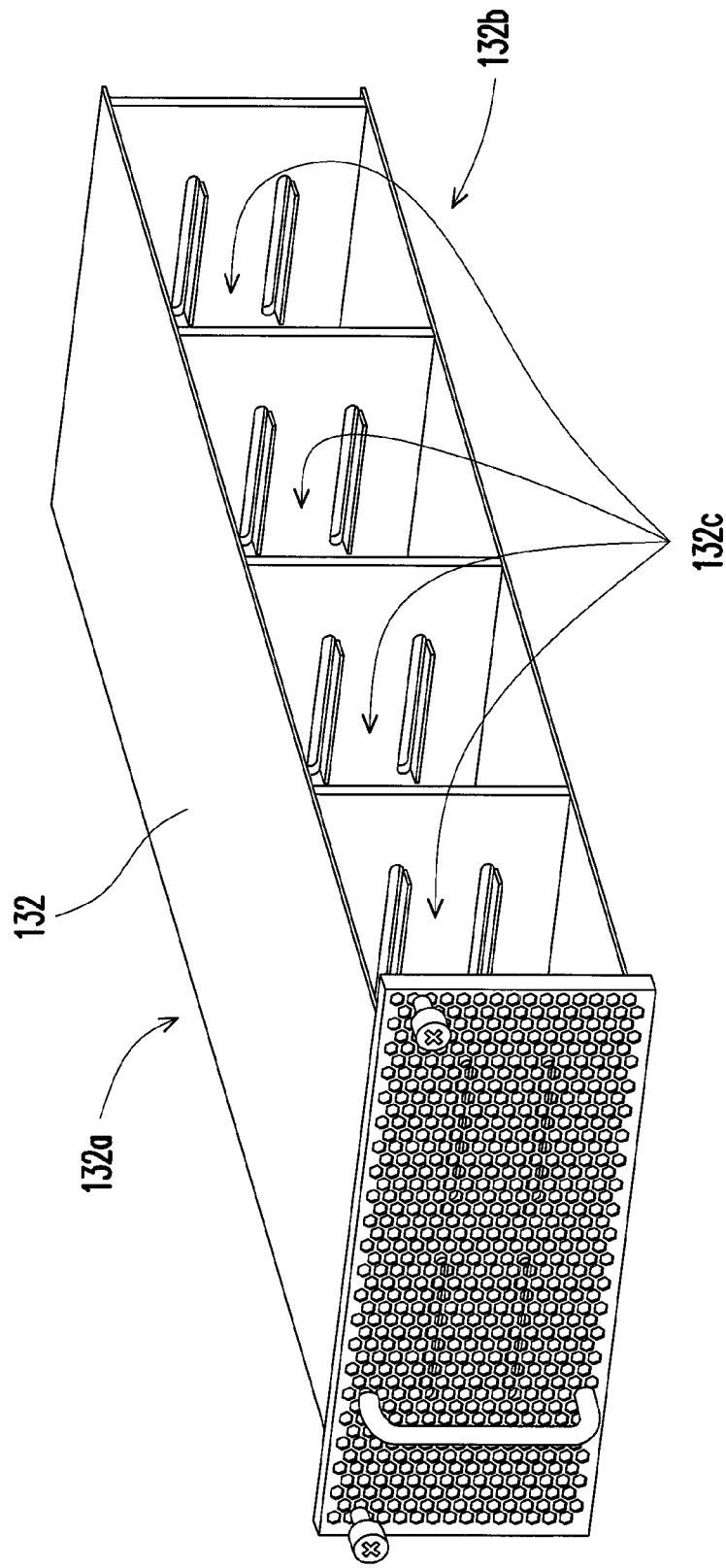
FIG. 5 is a three-dimensional view of a part of components of the hard disc module of FIG. 4.

FIG. 4 is a three-dimensional view of the hard disc module of FIG. 1. FIG. 5 is a three-dimensional view of a part of components of the hard disc module of FIG. 4.

Figure 6:
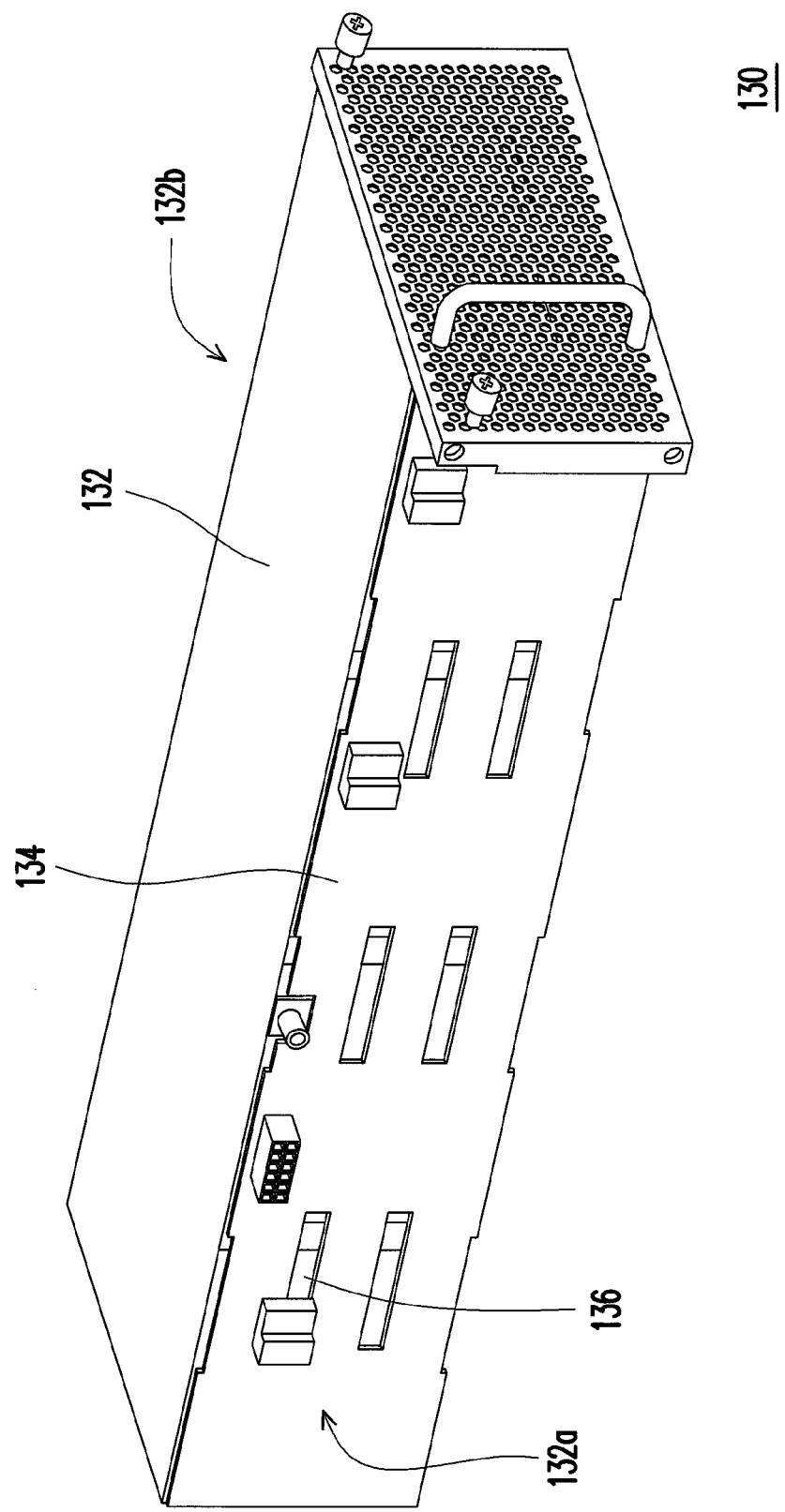
FIG. 6 is a three-dimensional view of the hard disc module of FIG. 4 viewing from another viewing angle.

FIG. 6 is a three-dimensional view of the hard disc module of FIG. 4 viewing from another viewing angle. Referring to FIG. 2 and FIG. 4 to FIG. 6, the hard disc module 130 includes a hard disc cage 132, a back plate 134 and a plurality of hard discs 136. The hard disc cage 132 is suitable for sliding into the second sub-space 114 from the front end 110$a$. The hard disc cage 132 has a first side 132$a$ and a second side 132$b$ parallel to the side plates 110d. The second side 132b has a plurality of hard disc openings 132c. The back plate 134 is fixed to the first side 132a of the hard disc cage 132 and is parallel to the middle plate 115. The hard discs 136 are detachablly disposed in the hard disc cage 132 and electrically connected to the back plate 134. When the hard disc cage 132 is pulled out from the chassis 110, the hard discs 136 are suitable for being installed to or pulled out from the hard disc cage 132 through the hard disc openings 132c.

Referring to FIG. 2 and FIG. 3, the server of the present embodiment further includes a cable arranging module 125. The cable arranging module 125 includes a fixing frame 125a, a chain structure 125b and a cable set 125c. The cable set 125c includes the data transmission lines 140a and the second power line 140c. The fixing frame 125a is fixed on the middle plate 115. The chain structure 125b is formed by a plurality of pivoted elements 50 pivoted in sequence. One end of the chain structure 125b is connected to the fixing frame 125a, and another end of the chain structure 125b is connected to the hard disc cage 132. The fixing frame 125a and the chain structure 125b commonly form a chamber. The cable set 125c is located in the chamber and electrically connected to the transfer plate 120 and the back plate 134.

Figure 7:
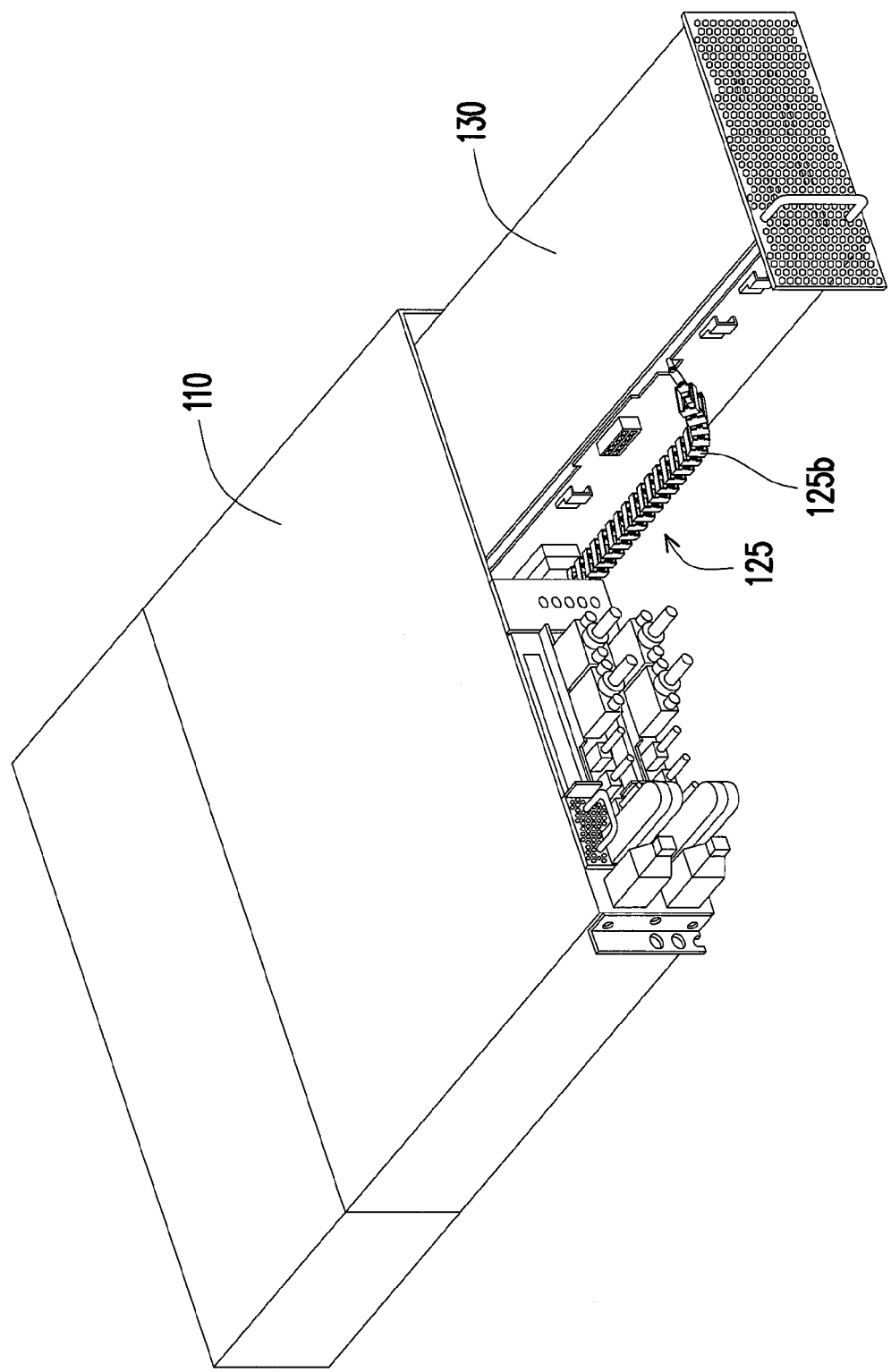
FIG. 7 is a three-dimensional view of the server of FIG. 1 in case that a hard disc module is pulled out from a chassis.

FIG. 7 is a three-dimensional view of the server of FIG. 1 in case that the hard disc module is pulled out from the chassis. When the hard disc module 130 is located in the chassis 110 as that shown in FIG. 1 to FIG. 3, the chain structure 125b is bended and contained in the chassis 110. When the hard disc module 130 is pulled out from the chassis 110, the chain structure 125b drives the cable set 125c of FIG. 3 to be curved and move. When the hard disc module 130 is pulled out from the chassis 110 entirely as that shown in FIG. 7, the chain structure 125c is extended and at least partially located out of the chassis 110.

Referring to FIG. 2 and FIG. 3, the server 100 of the present embodiment further includes a plurality of cooling fans 170 (four cooling fans are illustrated) and a plurality of third power lines 140d (four third power lines are illustrated). The cooling fans 170 are disposed at the back end 110b for cooling the hard disc module 130 and the main board module 150. The third power lines 140d are connected between the cooling fans 170 and the transfer plate 120 for providing the power required by the cooling fans 170. In detail, the transfer plate 120 has a plurality of connectors 122 (four connectors are illustrated) and a first surface 120a and a second surface 120b opposite to the first surface 120a. The first surface 120a faces to the front end 110a, and the second surface 120b faces to the back end 110b. The connectors 122 are disposed on the first surface 120a, and the third power lines 140d are connected to the connectors 122, and extends towards the second surface 120b to connect the cooling fans 170. As shown in FIG. 2, the main board module 150, the hard disc module 130 and the cooling fans 170 in the chassis 110 are arranged in a high density, so that the server 100 may have a small size to save a configuration space.

Moreover, in the present embodiment, the server 100 further includes a spacing plate 180. The spacing plate 180 is disposed at the back end 110b. A part of the cooling fans 170 is disposed at one side of the spacing plate 180 and is aligned to the main board module 150, and another part of the cooling fans 170 is disposed at another side of the spacing plate 180 and is aligned to the hard disc module 130, so as to independently cool down the main board module 150 and the hard disc module 130, and improve a cooling efficiency.

In the present embodiment, the transfer plate 120 further has a connector 124, connectors 126 (three are illustrated), a connector 128 and a connector 129. The connector 128 is connected to the first power line 140b, so that the transfer plate 120 can receive power from the external power supply. The connector 124 is connected to the main board module 150, so that the main board module 150 can obtain the power from the external power supply through the transfer plate 120 and the first power line 140b. The connectors 126 are respectively connected to the data transmission lines 140a, so that the main board module 150 can be connected to the hard disc module 130 through the transfer plate 120 and the data transmission lines 140a for data transmission. The connector 129 is connected to the second power line 140c, so that the hard disc module 130 can obtain power from the transfer plate 120 through the second power line 140c.

As shown in FIG. 1, the server 100 of the present embodiment further includes a power indicating lamp 190. The power indicating lamp 190 is disposed at the front end 110a of the chassis 110 for indicating a power on state or a power off state of the server 100. In other words, the front end 110a of the chassis 110 is integrated as an operation interface for the user to plug or unplug the power line and the data transmission line, pull out the main board module 150 and the hard disc module 130 and view the power indicating lamp 190, so as to facilitate the operation of the user.

Figure 8:
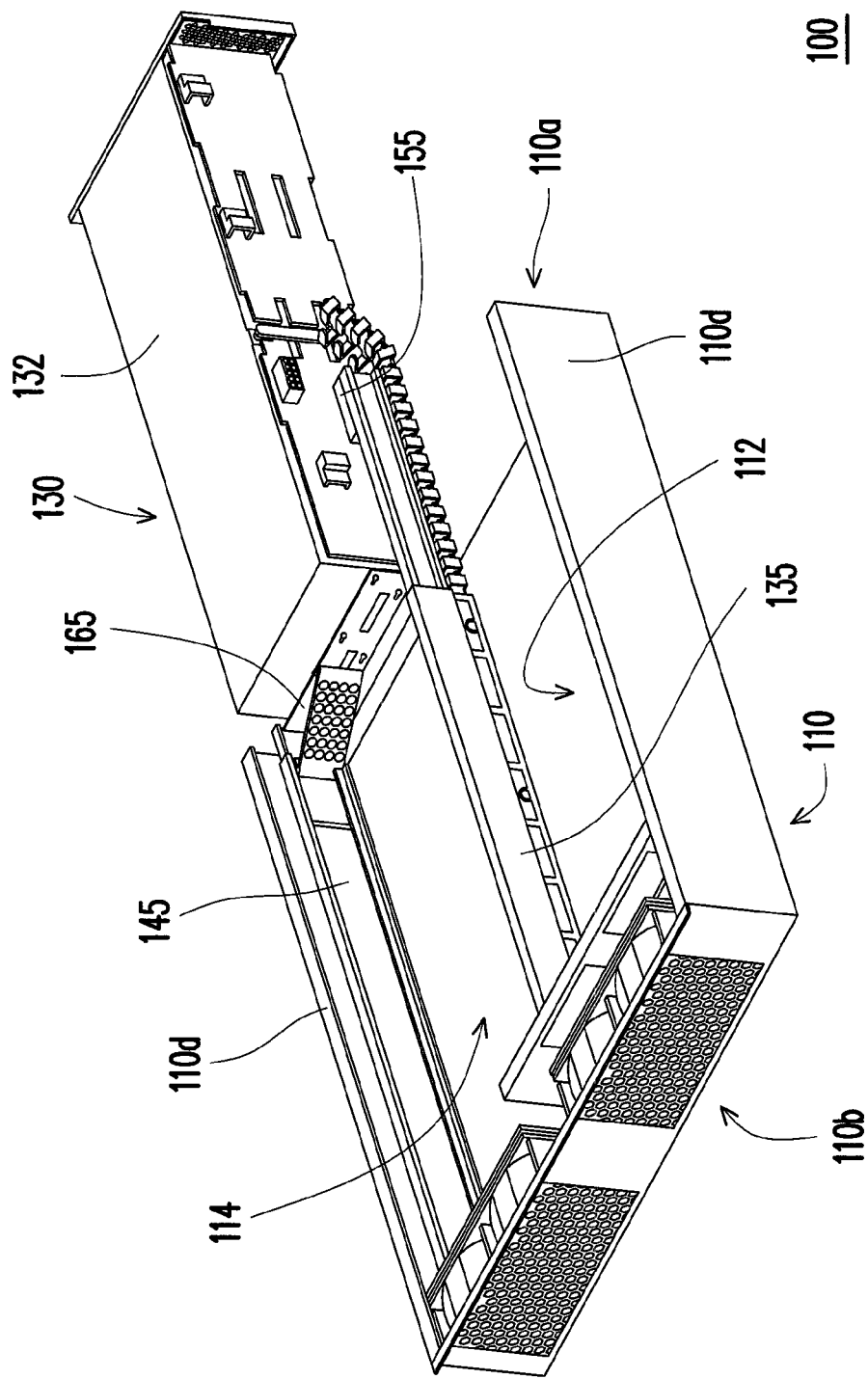
FIG. 8 is a three-dimensional view of a part of components of the server of FIG. 7.

FIG. 8 is a three-dimensional view of a part of components of the server of FIG. 7. Referring to FIG. 8, the server 100 further includes a first slide rail 135, a second slide rail 145, a first sliding member 155 and a second sliding member 165. The first slide rail 135 and the second slide rail 145 are disposed in the second sub-space 114 and parallel to the two side plates 110d. The first sliding member 155 and the second sliding member 165 are slidably disposed on the first slide rail 135 and the second slide rail 145, respectively, where the hard disc cage 132 is connected to the first sliding member 155 and the second sliding member 165 and located between the first slide rail 135 and the second slide rail 145. The hard disc module 130 is suitable for being entirely pulled out from the front end 110a of the chassis 110 as the first sliding member 155 and the second sliding member 165 are slid relative to the first slide rail 135 and the second slide rail 145.

Figure 9:
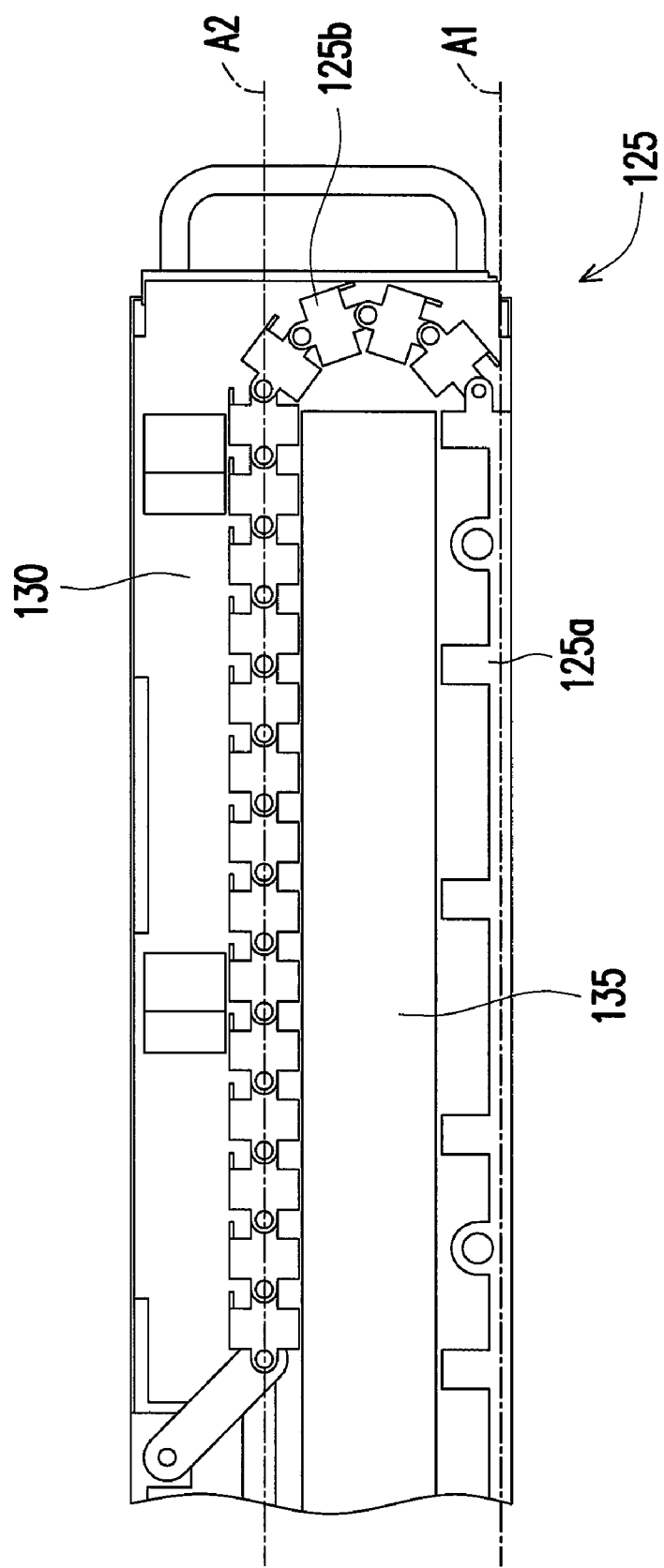
FIG. 9 is a partial side view of a cable arranging module of FIG. 3.
Figure 10:
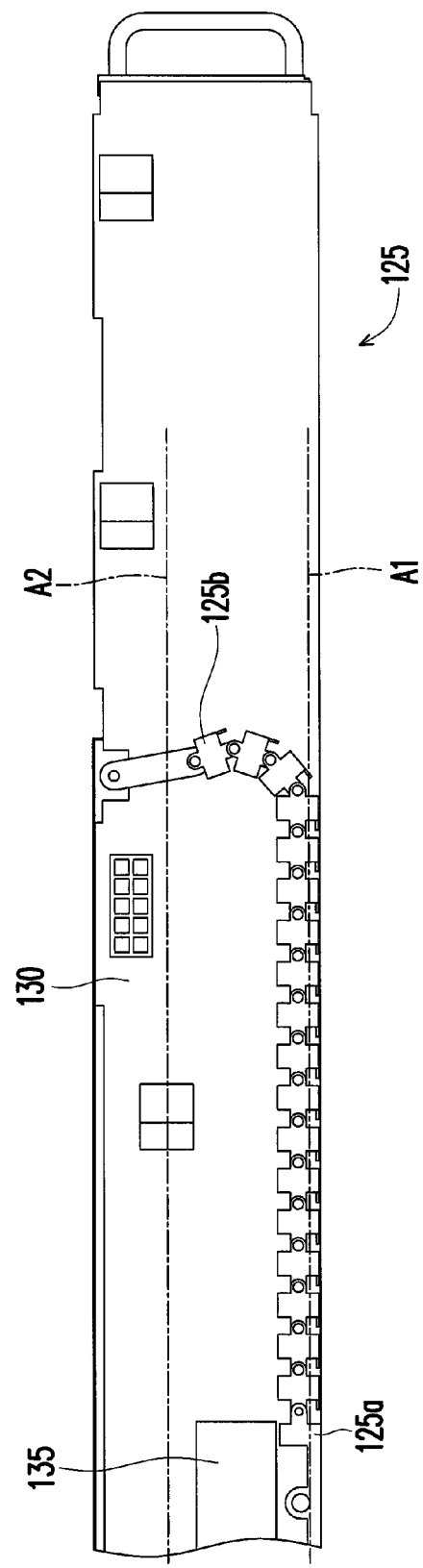
FIG. 10 is partial side view of a cable arranging module of FIG. 7.

FIG. 9 is a partial side view of the cable arranging module of FIG. 3. FIG. 10 is partial side view of the cable arranging module of FIG. 7. Referring to FIG. 9 and FIG. 10, the fixing frame 125a is extended along a first axial line A1. The first axial line A1 is parallel to an extending direction of the first slide rail 135 and located under the first slide rail 135. When the hard disc module 130 is located in the chassis 110, a part of the chain structure 125b is supported on the first slide rail 135, and is located on a second axial line A2 parallel to the first axial line A1. When the hard disc module 130 is slid out from the chassis 110 along the first slide rail 135 and the second slide rail 145 as that shown in FIG. 8, the chain structure 125b supported on the first slide rail 135 departs from the first slide rail 135 along the second axial line A2, and is at least partially moved to the first axial line A1, and a part of the cable set 125c (marked in FIG. 3) is curved along with the chain structure 125b.

In summary, in the invention, the hard disc module, the main board module, the power connection interface and the data transmission interface of the server are all located at the front end of the chassis. In this way, the user can pull out the hard disc module and the main board module and plug or unplug the power line and the data transmission line from the front end of the chassis, so that utilization convenience is improved. Moreover, the main board module, the hard disc module and the cooling fans in the chassis are arranged in a high density, so that the server may have a small size to save a configuration space.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A server, comprising:
   a chassis, having a bottom plate, two side plates, a front end and a back end;
   a middle plate, disposed in the chassis, wherein the middle plate is perpendicular to the bottom plate and parallel to the side plates, and divides the chassis into a first sub-space and a second sub-space;
   a transfer plate, disposed in the first sub-space and adjacent to the back end;
   a main board module, disposed in the first sub-space, and suitable for being pulled out from the front end, wherein the main board module is electrically connected to the transfer plate;
   a hard disc module, disposed in the second sub-space, and suitable for being pulled out from the front end, and the hard disc module comprising:
      a hard disc cage, suitable for sliding into the second sub-space from the front end, wherein the hard disc cage has a first side and a second side parallel to the side plates, and the second side has a plurality of hard disc openings;
      a back plate, fixed to the first side of the hard disc cage and parallel to the middle plate; and
      a plurality of hard discs, detachablly disposed in the hard disc cage and electrically connected to the back plate, wherein when the hard disc cage is pulled out from the chassis, the hard discs are suitable for being installed to or pulled out from the hard disc cage through the hard disc openings; and
   a cable arranging module, comprising:
      a fixing frame, fixed on the middle plate;
      a chain structure, formed by a plurality of pivoted elements pivoted in sequence, wherein a first end of the chain structure is connected to the fixing frame, and a second end of the chain structure is connected to the hard disc cage, and the fixing frame and the chain structure commonly form a chamber; and
      a cable set, located in the chamber and electrically connected to the transfer plate and the back plate,
      wherein when the hard disc module is located in the chassis, the chain structure is bended and contained in the chassis,
      when the hard disc module is pulled out from the chassis, the chain structure drives the cable set to be curved and moved,
      when the hard disc module is pulled out from the chassis entirely, the chain structure is extended and at least partially located out of the chassis.

2. The server as claimed in claim 1, further comprising a plurality of cooling fans disposed at the back end.

3. The server as claimed in claim 2, further comprising a plurality of power lines, connected between the cooling fans and the transfer plate.

4. The server as claimed in claim 3, wherein the transfer plate has a plurality of connectors and a first surface and a second surface opposite to the first surface, the first surface faces to the front end, and the second surface faces to the back end, the connectors are disposed on the first surface, and the power lines are connected between the connectors and the cooling fans.

5. The server as claimed in claim 2, further comprising a spacing plate disposed at the back end, wherein a part of the cooling fans is disposed at one side of the spacing plate and aligned to the main board module, and another part of the cooling fans is disposed at another side of the spacing plate and aligned to the hard disc module.

6. The server as claimed in claim 1, further comprising a power indicating lamp disposed at the front end.

7. The server as claimed in claim 1, further comprising:
   a data transmission interface, disposed at the front end and connected to the main board module;
   a power connection interface, disposed at the front end and suitable for connecting an external power supply; and
   a first power line, connected between the power connection interface and the transfer plate,
   wherein the cable set comprises a plurality of data transmission lines and a second power line, the data transmission lines are connected between the hard disc module and the transfer plate, and the second power line is connected between the transfer plate and the hard disc module, and the transfer plate has a plurality of connectors respectively connected to the main board module, the data transmission lines, the first power line and the second power line.

8. The server as claimed in claim 1, further comprising:
   a first slide rail and a second slide rail, disposed in the second sub-space and parallel to the two side plates; and
   a first sliding member and a second sliding member, slidably disposed on the first slide rail and the second slide rail, respectively, wherein the hard disc cage is connected to the first sliding member and the second sliding member and located between the first slide rail and the second slide rail, the hard disc module is suitable for being entirely pulled out from the front end of the chassis as the first sliding member and the second sliding member are slid relative to the first slide rail and the second slide rail.

9. The server as claimed in claim 8, wherein the fixing frame is extended along a first axial line, and the first axial line is parallel to an extending direction of the first slide rail and located under the first slide rail, when the hard disc module is located in the chassis, a part of the chain structure is supported on the first slide rail, and is located on a second axial line parallel to the first axial line, and when the hard disc module is slid out from the chassis along the first slide rail and the second slide rail, the chain structure supported on the first slide rail departs from the first slide rail along the second axial line, and is at least partially moved to the first axial line, and a part of the cable set is curved along with the chain structure.

* * * * *